United States Patent
Hirayama et al.

(10) Patent No.: US 11,377,550 B2
(45) Date of Patent: Jul. 5, 2022

(54) PHOTOSENSITIVE EPOXY RESIN COMPOSITION FOR FORMATION OF OPTICAL WAVEGUIDE, PHOTOSENSITIVE FILM FOR FORMATION OF OPTICAL WAVEGUIDE, OPTICAL WAVEGUIDE PRODUCED BY USING THE EPOXY RESIN COMPOSITION OR THE PHOTOSENSITIVE FILM, AND HYBRID FLEXIBLE PRINTED WIRING BOARD FOR OPTICAL/ELECTRICAL TRANSMISSION

(71) Applicant: NITTO DENKO CORPORATION, Ibaraki (JP)

(72) Inventors: Tomoyuki Hirayama, Ibaraki (JP); Naoyuki Tanaka, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 981 days.

(21) Appl. No.: 16/071,172

(22) PCT Filed: Jan. 20, 2017

(86) PCT No.: PCT/JP2017/001842
§ 371 (c)(1),
(2) Date: Jul. 19, 2018

(87) PCT Pub. No.: WO2017/130849
PCT Pub. Date: Aug. 3, 2017

(65) Prior Publication Data
US 2021/0206962 A1 Jul. 8, 2021

(30) Foreign Application Priority Data
Jan. 29, 2016 (JP) .............................. JP2016-015458

(51) Int. Cl.
| C08L 63/00 | (2006.01) |
| G02B 6/122 | (2006.01) |
| G03F 7/00 | (2006.01) |
| G03F 7/028 | (2006.01) |
| H05K 1/02 | (2006.01) |
| G02B 6/12 | (2006.01) |

(52) U.S. Cl.
CPC .............. C08L 63/00 (2013.01); G02B 6/122 (2013.01); G03F 7/0005 (2013.01); G03F 7/028 (2013.01); H05K 1/028 (2013.01); H05K 1/0274 (2013.01); C08L 2205/025 (2013.01); C08L 2205/03 (2013.01); G02B 2006/12069 (2013.01); H05K 2201/10121 (2013.01)

(58) Field of Classification Search
CPC .............. C08L 63/00; C08L 2205/025; C08L 2205/03; G02B 6/122; G02B 2006/12069; G03F 7/005; G03F 7/028; H05K 1/0274; H05K 1/028; H05K 2201/10121
See application file for complete search history.

(56) References Cited

U.S. PATENT DOCUMENTS

| 7,097,958 | B2* | 8/2006 | Sugano | .................... | G03F 7/038 |
| | | | | | 430/280.1 |
| 7,473,717 | B2* | 1/2009 | Muenz | .................... | C08G 59/40 |
| | | | | | 521/135 |
| 8,200,059 | B2* | 6/2012 | Shibata | .................. | C09J 163/00 |
| | | | | | 385/141 |
| 8,867,885 | B2* | 10/2014 | Hirayama | ............... | G03F 7/004 |
| | | | | | 385/143 |
| 9,075,303 | B2* | 7/2015 | Hirayama | ............... | G03F 7/004 |
| 2004/0043327 | A1* | 3/2004 | Sugano | .................... | G03F 7/038 |
| | | | | | 430/280.1 |
| 2004/0266899 | A1* | 12/2004 | Muenz | .................... | C08L 63/00 |
| | | | | | 521/135 |
| 2010/0129045 | A1* | 5/2010 | Shibata | .................. | C09J 161/06 |
| | | | | | 385/141 |

(Continued)

FOREIGN PATENT DOCUMENTS

| CN | 102365330 A | 2/2012 |
| CN | 103309153 A | 9/2013 |

(Continued)

OTHER PUBLICATIONS

Notification of Transmittal of Translation of the International Preliminary Report on Patentability (Form PCT/IB/338) issued in counterpart International Application No. PCT/JP2017/001842 dated Aug. 9, 2018, with Forms PCT/IB/373 and PCT/ISA/237. (8 pages).
Office Action dated Aug. 7, 2019, issued in counterpart CN Application No. 201780007230.2, with English translation. (10 pages).
International Search Report dated Apr. 11, 2017, issued in counterpart International Application No. PCT/JP2017/001842 (2 pages).
Office Action dated Jun. 5, 2020, issued in counterpart TW application No. 106102160, with English translation. (11 pages).

(Continued)

*Primary Examiner* — Peter Radkowski
(74) *Attorney, Agent, or Firm* — WHDA, LLP

(57) ABSTRACT

A photosensitive epoxy resin composition for formation of an optical waveguide is provided, which contains an epoxy resin component and a photo-cationic polymerization initiator, wherein the epoxy resin component includes: (a) a solid bisphenol-A epoxy resin having a softening point of not higher than 105° C.; (b) a solid polyfunctional aliphatic epoxy resin having a softening point of not higher than 105° C.; and (c) a liquid long-chain bifunctional semi-aliphatic epoxy resin, wherein the epoxy resin (a) is present in a proportion of 60 to 70 wt. % based on the weight of the epoxy resin component, wherein the epoxy resin (b) is present in a proportion of 20 to 35 wt. % based on the weight of the epoxy resin component, wherein the epoxy resin (c) is present in a proportion of 5 to 10 wt. % based on the weight of the epoxy resin component.

10 Claims, No Drawings

(56) References Cited

U.S. PATENT DOCUMENTS

| | | |
|---|---|---|
| 2011/0280531 A1 | 11/2011 | Hirayama |
| 2012/0033913 A1 | 2/2012 | Kondou et al. |
| 2013/0236149 A1* | 9/2013 | Hirayama ............... C08L 63/00 385/123 |
| 2013/0287351 A1* | 10/2013 | Hirayama ............ C08G 59/245 385/123 |
| 2016/0070029 A1 | 3/2016 | Hirayama |
| 2016/0085151 A1 | 3/2016 | Hirayama et al. |
| 2016/0238788 A1 | 8/2016 | Hirayama |

FOREIGN PATENT DOCUMENTS

| | | |
|---|---|---|
| CN | 103376647 A | 10/2013 |
| JP | 4-339852 A | 11/1992 |
| JP | 2001-281475 A | 10/2001 |
| JP | 2008-308542 A | 12/2008 |
| JP | 2010-230944 A | 10/2010 |
| JP | 2010-243920 A | 10/2010 |
| JP | 2011-27903 A | 2/2011 |
| JP | 2011-237645 A | 11/2011 |
| JP | 2012-128360 A | 7/2012 |
| JP | 2015-197879 A | 11/2015 |
| TW | 201038609 A | 11/2010 |
| TW | 201443143 A | 11/2014 |
| WO | 2006/077862 A1 | 7/2006 |
| WO | 2014/174924 A1 | 10/2014 |
| WO | 2015/068593 A1 | 5/2015 |

OTHER PUBLICATIONS

Office Action dated Jun. 25, 2019, issued in counterpart JP application No. 2016-015458, with English translation. (8 pages).

* cited by examiner

PHOTOSENSITIVE EPOXY RESIN COMPOSITION FOR FORMATION OF OPTICAL WAVEGUIDE, PHOTOSENSITIVE FILM FOR FORMATION OF OPTICAL WAVEGUIDE, OPTICAL WAVEGUIDE PRODUCED BY USING THE EPOXY RESIN COMPOSITION OR THE PHOTOSENSITIVE FILM, AND HYBRID FLEXIBLE PRINTED WIRING BOARD FOR OPTICAL/ELECTRICAL TRANSMISSION

TECHNICAL FIELD

The present disclosure relates to an optical waveguide formation photosensitive epoxy resin composition and an optical waveguide formation photosensitive film to be used as a material for formation of a cladding layer or the like of an optical waveguide in an optical/electrical transmission hybrid flexible printed wiring board which is widely used for optical communications, optical information processing and other general optics. The present disclosure further relates to an optical waveguide produced by using the epoxy resin composition or the photosensitive film, and to a hybrid flexible printed wiring board for optical/electrical transmission.

BACKGROUND ART

Conventionally, various photosensitive epoxy resin compositions are employed as optical waveguide formation materials for hybrid flexible printed wiring boards for optical/electrical transmission. Where a cladding layer is formed in a predetermined pattern by using any of the photosensitive epoxy resin compositions, for example, the formation of the predetermined cladding layer pattern is achieved by irradiation with ultraviolet radiation (UV) via a photomask. More specifically, the cladding layer is formed by using a liquid photosensitive epoxy resin composition as an optical waveguide formation material to form a film (layer) and then irradiating the film (layer) with UV radiation via a photomask.

Such a photosensitive epoxy resin composition has high photocurability, but is disadvantageous in that the photosensitive epoxy resin composition cannot be employed for a continuous process such as an R-to-R (roll-to-roll) process because of the surface tackiness of a coating film of the photosensitive epoxy resin composition (the film of the photosensitive epoxy resin composition is liable to be broken when being brought into contact with a roll) and, hence, has lower productivity (PTL 1). Therefore, a resin component that is solid at an ordinary temperature is generally used as a photosensitive resin for R-to-R adaptability. As the molecular weight of the resin component increases, the flexibility of an uncured amorphous film of the resulting resin composition is increased, but the patterning resolution is reduced. As the molecular weight of the resin component decreases, on the other hand, the patterning resolution is increased, but the flexibility is reduced. Problematically, the flexibility and the patterning resolution of the film are in tradeoff relation. Therefore, there is a demand for an optical waveguide material which satisfies the requirements for both the flexibility and the patterning resolution of the film. For example, a resin composition containing an epoxy-containing acryl rubber, urethane (meth)acrylate or a (meth)acrylate free from a urethane bond is proposed as a cladding layer forming material for an optical waveguide (PTL 2).

Incidentally, the optical waveguide cladding layer forming material needs to satisfy requirements for various physical properties such as lower refractive index, higher transparency, higher-resolution patternability and higher heat resistance in a cured state according to its use purpose. Therefore, makers conduct studies to prepare a forming material satisfying the aforementioned property requirements by selecting proper ingredients and determining a balanced formulation in production of the optical waveguide.

In the aforementioned R-to-R process for mass production, a dry film technique is generally employed in which the uncured film is used in a dry film form. In development of the material, requirements for R-to-R process adaptability of the dry film material (e.g., lower tackiness and flexibility of the uncured film) consequently reduces the material design flexibility. In addition to the reduction in material design flexibility, the need for provision of lamination bases on opposite surfaces of the dry film is disadvantageous for resource saving and costs in the formation of the dry film. Therefore, the adaptability to a wet process is also regarded as important in the development of the material (PTL 3).

In view of such technical background, a photosensitive epoxy resin composition satisfying the aforementioned property requirements has been developed, for example, by using a specific novolak polyfunctional epoxy resin as a base material and adding various resins to the epoxy resin (PTL 4).

RELATED ART DOCUMENTS

Patent Documents

PTL 1: JP-A-2001-281475
PTL 2: JP-A-2011-27903
PTL 3: JP-A-2010-230944
PTL 4: JP-A-2011-237645

SUMMARY OF INVENTION

Where such an optical waveguide formation photosensitive resin composition is to be used as the cladding layer forming material, the resin composition preferably has a lower refractive index for the light confining property of the cladding layer and generally has a formulation containing an aliphatic resin as a main ingredient.

When an optical/electrical transmission hybrid board (opto-electric hybrid board) or a like product involving optical path change is produced, for example, it is necessary to perform a mirror forming process (45-degree mirror forming process) on a surface of a cladding layer of an optical waveguide on the board by applying a laser beam at an angle of 45 degrees to the cladding layer surface.

Where the resin composition having the formulation containing the aliphatic resin as the main ingredient is used as the cladding layer forming material, as described above, laser processability is deteriorated in the 45-degree mirror forming process with the laser because the resin composition has a poorer laser light absorption property. This may result in a higher light loss in an optical path changing portion. Therefore, the functional requirement for the lower refractive index of the cladding layer and the laser processability are problematically in tradeoff relation. To cope with this, there is a demand for a cladding layer forming material which has proper R-to-R process adaptability as well as a lower refractive index, excellent patternability, and excellent laser processability.

In view of the foregoing, the present disclosure provides an optical waveguide formation photosensitive epoxy resin composition and an optical waveguide formation photosensitive film having higher R-to-R adaptability, a lower refractive index, excellent patternability, and excellent laser processability for use as a cladding layer forming material, and provides an optical waveguide produced by using the photosensitive epoxy resin composition or the photosensitive film and a hybrid flexible printed wiring board for optical/electrical transmission.

According to a first inventive aspect to achieve the above object, there is provided a photosensitive epoxy resin composition for formation of an optical waveguide, the photosensitive epoxy resin composition containing an epoxy resin component and a photo-cationic polymerization initiator, wherein the epoxy resin component includes: (a) a solid bisphenol-A epoxy resin having a softening point of not higher than 105° C.; (b) a solid polyfunctional aliphatic epoxy resin having a softening point of not higher than 105° C.; and (c) a liquid long-chain bifunctional semi-aliphatic epoxy resin, wherein the epoxy resin (a) is present in a proportion of 60 to 70 wt. % based on the weight of the epoxy resin component, wherein the epoxy resin (b) is present in a proportion of 20 to 35 wt. % based on the weight of the epoxy resin component, wherein the epoxy resin (c) is present in a proportion of 5 to 10 wt. % based on the weight of the epoxy resin component.

According to a second inventive aspect, there is provided an optical waveguide formation photosensitive film formed from the optical waveguide formation photosensitive epoxy resin composition of the first inventive aspect.

According to a third inventive aspect, there is provided an optical waveguide, which includes a substrate, a cladding layer provided on the substrate, and a core layer provided in a predetermined pattern in the cladding layer for transmission of an optical signal, wherein the cladding layer is a cladding layer formed by curing the optical waveguide formation photosensitive epoxy resin composition of the first inventive aspect or the optical waveguide formation photosensitive film of the second inventive aspect.

According to a fourth inventive aspect, there is provided a hybrid flexible printed wiring board for optical/electrical transmission, which includes the optical waveguide of the third inventive aspect.

The inventors conducted intensive studies to provide a photosensitive epoxy resin composition which has proper R-to-R adaptability, a lower refractive index, excellent patternability, and excellent laser processability for use as a cladding layer forming material. As a result, the inventors found that, where the epoxy resin component containing the solid epoxy resin as the main ingredient is used, the intended object can be achieved.

[1] R-to-R Adaptability (Flexibility of Uncured Film)

The inventors employ the epoxy resin component containing the solid epoxy resin as the main ingredient, and focus on the softening point of the solid epoxy resin. In general, the resin has flexibility attributable to toughness thereof caused by entanglement of molecules thereof and diversified possible conformations of main chains of the molecules thereof. A solid epoxy resin having a higher softening point and a molecular weight higher than a certain level exhibits higher flexibility in an uncured state. This is attributable to the fact that the higher molecular weight resin has a higher degree of entanglement (interaction) of the main chains thereof. However, a varnish of the resin composition having such a formulation is liable to have a higher viscosity, resulting in the need for use of an excess amount of a solvent component. Therefore, the varnish is not suitable for formation of a thicker coating film, and is liable to be poorer in patternability.

On the other hand, a material having a lower softening point, i.e., the specific solid epoxy resin having the specific softening point as in the present disclosure, is expected to have higher flexibility due to diversified possible conformations of main chains of molecules thereof without the interaction of the main chains because the main chains are weakly entangled. On the other hand, a material having a softening point of a middle temperature range between a higher temperature range and a lower temperature range is significantly influenced by the drawbacks of the higher-softening point material and the lower-softening point material, and tends to have poorer flexibility.

In the present disclosure, the amount of a liquid component to be added can be reduced to a minimum level free from the tackiness by using the specific solid epoxy resin having the specific softening point as the main ingredient. As a result, the resin composition is imparted with proper flexibility in the uncured state without tackiness. Where a lower-softening point epoxy resin is used as the main ingredient for the flexibility in the uncured state, however, the resin composition problematically has poorer flexibility after the curing. This problem is approached by adding the liquid long-chain bifunctional semi-aliphatic epoxy resin (c) to the epoxy resin component.

[2] Refractive Index

The lower refractive index is an indispensable property for the optical waveguide cladding layer forming material. In the formulation design, an aliphatic resin is generally used as a base material to impart the resin composition with a lower refractive index. However, this formulation is disadvantageous for the mirror forming process with the laser. Therefore, if the refractive index of the resin composition can be reduced to a lower limit of about 1.56, the resin composition can function as the optical waveguide cladding layer forming material. In the present disclosure, the cladding layer is imparted with a lower refractive index by the formulation design of the epoxy resin component described above.

[3] Patternability

In order to impart a photocurable resin composition with photolithography patternability, it is generally essential to add a polyfunctional epoxy resin to the resin composition. In the present disclosure, the resin composition is imparted with proper patternability by blending the aforementioned epoxy resin component in the resin composition.

[4] Laser Processability

For fine laser processing, it is preferred to blend an aromatic epoxy resin alone as an epoxy resin component. In order to provide a proper difference in refractive index between the cladding layer and the core layer, however, it is essential to add a certain amount of an aliphatic epoxy resin to the cladding layer forming material. In the present disclosure, a minimum amount of the aliphatic epoxy resin that allows for proper laser processability is added to the resin composition. Thus, the requirements for the lower refractive index and the laser processability of the cladding layer are satisfied by properly designing the formulation of the epoxy resin component as described above.

The physical property requirements can be satisfied by thus using the aforementioned specific epoxy resin for the epoxy resin component to meet all the features described in the items [1] to [4].

According to the present disclosure, the optical waveguide formation photosensitive epoxy resin composition contains the epoxy resin component including the specific epoxy resins (a) to (c) described above, and the photo-cationic polymerization initiator, wherein the specific epoxy resins (a) to (c) are respectively present in the proportions of the aforementioned ranges. Therefore, where the optical waveguide formation photosensitive epoxy resin composition is used for formation of the cladding layer of the optical waveguide, the cladding layer can be formed as having higher R-to-R adaptability, a lower refractive index, excellent patternability, and excellent laser processability without changing the conventional production process.

Where the epoxy resin component includes only the aforementioned specific epoxy resins (a) to (c), the cladding layer can be formed as having further higher R-to-R adaptability, a lower refractive index, excellent patternability, and excellent laser processability.

Where the solid bisphenol-A epoxy resin (a) has a softening point of 60° C. to 95° C. and the solid polyfunctional aliphatic epoxy resin (b) has a softening point of 60° C. to 95° C., the R-to-R adaptability can be further improved.

DESCRIPTION OF EMBODIMENTS

Next, embodiments of the present disclosure will be described in detail. However, it should be understood that the present disclosure be not limited to these embodiments.

<<Photosensitive Epoxy Resin Composition for Formation of Optical Waveguide>>

An inventive photosensitive epoxy resin composition for formation of an optical waveguide (hereinafter sometimes referred to simply as "photosensitive epoxy resin composition") is prepared by using a specific epoxy resin component and a photo-cationic polymerization initiator. In the present disclosure, the term "liquid" or "solid" means that a substance is fluid in a "liquid" state or nonfluid in a "solid" state at an ordinary temperature (25° C.±5° C.). In the present disclosure, the term "ordinary temperature" means a temperature range of 25° C.±5° C. as described above.

The ingredients will hereinafter be described one by one.

<Specific Epoxy Resin Component>

The specific epoxy resin component includes: (a) a specific solid bisphenol-A epoxy resin; (b) a specific solid polyfunctional aliphatic epoxy resin; and (c) a liquid long-chain bifunctional semi-aliphatic epoxy resin. These three epoxy resins are respectively present in predetermined proportions in the epoxy resin component.

The solid bisphenol-A epoxy resin (a) is solid at the ordinary temperature, and specific examples thereof include long-chain bifunctional aromatic bisphenol-A epoxy resins JER1001, JER1002, JER1003, and JER1007 (all available from Mitsubishi Chemical Corporation) and EPIKOTE 106FS available from Japan Epoxy Resin Co., Ltd., which may be used alone or in combination.

The solid bisphenol-A epoxy resin (a) is required to have a softening point of not higher than 105° C., more preferably 60° C. to 95° C. The lower limit of the softening point is typically a room temperature (25° C.), but is preferably 60° C. If the softening point of the solid bisphenol-A epoxy resin (a) is excessively high, the resin composition tends to have poorer R-to-R adaptability. The softening point of the solid bisphenol-A epoxy resin (a) is measured in conformity with JIS K7234-1986.

The proportion of the solid bisphenol-A epoxy resin (a) is preferably 60 to 70 wt. %, particularly preferably 60 to 65 wt. %, based on the weight of the epoxy resin component. If the proportion of the solid bisphenol-A epoxy resin (a) is excessively great, the resin composition is liable to have a higher refractive index, which may fall outside a refractive index range appropriate for an optical waveguide cladding material. If the proportion of the solid bisphenol-A epoxy resin (a) is excessively small, the resin composition is liable to be poorer in laser processability for the 45-degree mirror forming process.

The specific solid polyfunctional aliphatic epoxy resin (b) is solid at the ordinary temperature, and a specific example thereof is a 1,2-epoxy-4-(2-oxiranyl) cyclohexane adduct of 2,2-bis(hydroxymethyl)-1-butanol (e.g., EHPE3150 available from Daicel Chemical Industries, Ltd.) Further, an exemplary trifunctional solid aliphatic epoxy resin is 1,3,5-trisglycidyl isocyanurate (e.g., TEPIC-S available from Nissan Chemical Industries, Ltd. and having a softening point (melting point) of 95° C., and an exemplary bifunctional solid aliphatic epoxy resin is a hydrogenated bisphenol-A epoxy resin (e.g., YX-8040 available from Mitsubishi Chemical Corporation and having a softening point of 97° C.).

The solid polyfunctional aliphatic epoxy resin (b) is required to have a softening point of not higher than 105° C., more preferably 60° C. to 95° C. The lower limit of the softening point is typically a room temperature (25° C.), but is preferably 60° C. If the softening point of the solid polyfunctional aliphatic epoxy resin (b) is excessively high, the resin composition tends to have poorer R-to-R adaptability. The softening point of the solid polyfunctional aliphatic epoxy resin (b) is measured in conformity with JIS K7234-1986.

The proportion of the solid polyfunctional aliphatic epoxy resin (b) is preferably 20 to 35 wt. %, more preferably 25 to 30 wt. %, particularly preferably 28 to 30 wt. %, based on the weight of the epoxy resin component. If the proportion of the solid polyfunctional aliphatic epoxy resin (b) is excessively great, the resin composition is liable to be poorer in laser processability for the 45-degree mirror forming process. If the proportion of the solid polyfunctional aliphatic epoxy resin (b) is excessively small, the resin composition is supposedly liable to have a higher refractive index, which may fall outside the refractive index range appropriate for the optical waveguide cladding material. Further, the resin composition is liable to be poorer in photolithography patternability.

The liquid long-chain bifunctional semi-aliphatic epoxy resin (c) is liquid at the ordinary temperature, and an example thereof is an epoxy resin represented by the following general formula (1):

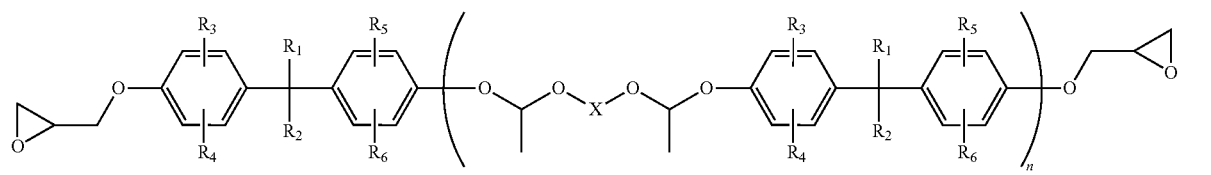

(1)

wherein $R_1$ and $R_2$ are each a hydrogen atom or a methyl group; $R_3$ to $R_6$ are each a hydrogen atom, a methyl group, a chlorine atom, or a bromine atom; X is a C2 to C15 alkylene group, an ethyleneoxy group, a di(ethyleneoxy) group, a tri(ethyleneoxy) group, a propyleneoxy group, a propyleneoxypropyl group, a di(propyleneoxy)propyl group, or a tri(propyleneoxy)propyl group; and n is a natural number, and has an average value of 1.2 to 5.

The epoxy resin represented by the above general formula (1) is liquid at the ordinary temperature, and has a molecular chain such as a polyalkyleneoxy chain having neither active hydrogen nor an active hydrogen-generating functional group, and epoxy groups at opposite terminals of the molecular chain.

In the formula (1), $R_1$ and $R_2$ are each a hydrogen atom or a methyl group, but preferably a methyl group. $R_3$ to $R_6$ are each a hydrogen atom, a methyl group, a chlorine atom, or a bromine atom, but preferably a hydrogen atom. X is a C2 to C15 alkylene group, an ethyleneoxy group, a di(ethyleneoxy) group, a tri(ethyleneoxy) group, a propyleneoxy group, a propyleneoxypropyl group, a di(propyleneoxy)propyl group, or a tri(propyleneoxy)propyl group. The repetition number n is a natural number, and has an average value of 1.2 to 5.

An example of the liquid long-chain bifunctional semi-aliphatic epoxy resin (c) is EPICLON EXA-4816 available from DIC Corporation.

The proportion of the liquid long-chain bifunctional semi-aliphatic epoxy resin (c) is 5 to 10 wt. % based on the weight of the epoxy resin component. If the proportion of the liquid long-chain bifunctional semi-aliphatic epoxy resin (c) is excessively great, a coating film formed from the resin composition is liable to be tacky after drying thereof, resulting in difficulty in application to the R-to-R process for the mass production. If the proportion of the liquid long-chain bifunctional semi-aliphatic epoxy resin (c) is excessively small, a film formed by curing the resin composition is liable to have poorer flexibility, thereby suffering from cracking when being used as a part of an optical waveguide. Thus, the resin composition has problems with mechanical properties.

In the present disclosure, the specific epoxy resin component includes the three epoxy resins, i.e., the specific solid bisphenol-A epoxy resin (a), the specific solid polyfunctional aliphatic epoxy resin (b), and the liquid long-chain bifunctional semi-aliphatic epoxy resin (c), in the predetermined proportions. Other epoxy resins may be used in addition to the epoxy resins (a), (b), and (c). More preferably, these three epoxy resins (a), (b), and (c) account for not less than 80 wt. % of the entire epoxy resin component. Particularly preferably, the epoxy resin component includes only the three epoxy resins, i.e., the specific solid bisphenol-A epoxy resin (a), the specific solid polyfunctional aliphatic epoxy resin (b), and the liquid long-chain bifunctional semi-aliphatic epoxy resin (c).

<Photo-Cationic Polymerization Initiator>

The photo-cationic polymerization initiator (photoacid generator) is used to impart the photosensitive epoxy resin composition with photocurability, e.g., curability by irradiation with ultraviolet radiation.

Examples of the photo-cationic polymerization initiator include triphenylsulfonium hexafluoroantimonate, triphenylsulfonium hexafluorophosphate, p-(phenylthio)phenyldiphenylsulfonium hexafluoroantimonate, p-(phenylthio)phenyldiphenylsulfonium hexafluorophosphate, 4-chlorophenyldiphenylsulfonium hexafluorophosphate, 4-chlorophenyldiphenylsulfonium hexafluoroantimonate, bis[4-diphenylsulfonio]phenyl]sulfide bishexafluorophosphate, bis[4-(diphenylsulfonio)phenyl]sulfide bishexafluoroantimonate, (2,4-cyclopentadiene-1-yl)[(1-methylethyl)benzene]-Fe-hexa fluorophosphate, and diphenyliodonium hexafluoroantimonate, which may be used alone or in combination.

Specific examples of the photo-cationic polymerization initiator include triphenylsulfonium hexafluoroantimonate types SP-170 (available from ADEKA Corporation), CPI-101A (available from San-Apro, Ltd.), and WPAG-1056 (available from Wako Pure Chemical Industries, Ltd.), and a diphenyliodonium hexafluoroantimonate type WPI-116 (available from Wako Pure Chemical Industries, Ltd.)

The proportion of the photo-cationic polymerization initiator is preferably 0.1 to 3 parts by weight, more preferably 0.25 to 1 part by weight, based on 100 parts by weight of the epoxy resin component of the photosensitive epoxy resin composition. If the proportion of the photo-cationic polymerization initiator is excessively small, it will be difficult to impart the resin composition with satisfactory photocurability (UV-curability). If the proportion of the photo-cationic polymerization initiator is excessively great, the photosensitivity tends to be increased, resulting in abnormal shaping in the patterning. Further, the required physical properties associated with an initial loss tend to be deteriorated.

As required, the inventive photosensitive epoxy resin composition may contain additives in addition to the specific epoxy resin component and the photo-cationic polymerization initiator described above. Examples of the additives include an adhesiveness imparting agent such as a silane or titanium coupling agent, an olefin oligomer, a cycloolefin oligomer or polymer (e.g., a norbornene polymer or the like), a synthetic rubber, or a silicone compound for enhancing the adhesiveness, various antioxidants such as a hindered phenol antioxidant and a phosphorus-containing antioxidant, a leveling agent and a defoaming agent. These additives may be properly blended, as long as the effects of the present disclosure are not impaired. These may be used alone or in combination.

The proportion of the antioxidant is preferably less than 3 parts by weight, particularly preferably not greater than 1 part by weight, based on 100 parts by weight of the epoxy resin component. If the proportion of the antioxidant is excessively great, the required physical properties associated with the initial loss tend to be deteriorated.

The inventive photosensitive epoxy resin composition can be prepared by mixing the specific epoxy resin component, the photo-cationic polymerization initiator and, as required, any of the additives in the predetermined proportions with stirring. Where the inventive photosensitive epoxy resin composition is prepared in the form of a coating varnish, the resulting mixture is preferably dissolved in an organic solvent with heating (e.g., to about 60° C. to about 120° C.) and stirring. The amount of the organic solvent to be used may be properly adjusted, and preferably set to, for example, 20 to 80 parts by weight, particularly preferably 30 to 60 parts by weight, based on 100 parts by weight of the epoxy resin component of the photosensitive epoxy resin composition. If the amount of the organic solvent to be used is excessively small, the prepared coating varnish tends to have a higher viscosity and hence poorer coatability. If the amount of the organic solvent to be used is excessively great, it will be difficult to form a thicker coating film with the use of the coating varnish.

Examples of the organic solvent to be used for the preparation of the coating varnish include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfurane, and dimethoxyethane. These organic solvents may be used alone or in combination in a predetermined amount, for example, within the aforementioned range so as to impart the varnish with a viscosity suitable for the coating.

<<Optical Waveguide>>

Next, an optical waveguide will be described, which is produced by using the inventive photosensitive epoxy resin composition as a cladding layer forming material.

The inventive optical waveguide includes, for example, a substrate, a cladding layer (under-cladding layer) provided in a predetermined pattern on the substrate, a core layer provided in a predetermined pattern on the cladding layer for transmitting an optical signal, and another cladding layer (over-cladding layer) provided over the core layer. In the inventive optical waveguide, the cladding layers are formed from the photosensitive epoxy resin composition described above. In the inventive optical waveguide, the cladding layers are required to have a lower refractive index than the core layer.

In the present disclosure, the optical waveguide may be produced, for example, through the following process steps. A substrate is prepared, and a cladding layer forming material (photosensitive varnish) prepared by dissolving the inventive photosensitive epoxy resin composition in an organic solvent is applied onto the substrate. After the application of the cladding layer forming material (photosensitive varnish), the organic solvent is removed by heat-drying. Thus, an optical waveguide formation photosensitive film is formed in an uncured film state. The photosensitive film is cured by irradiating a varnish-applied surface with light such as ultraviolet radiation and, as required, performing a heat treatment. Thus, an under-cladding layer (lower cladding layer portion) is formed.

Then, a core layer forming material (photosensitive varnish) is applied onto the under-cladding layer to form an uncured core formation layer. After the application of the core layer forming material (photosensitive varnish), the organic solvent may be removed by heat-drying in the same manner as described above, whereby a photosensitive film is formed in an uncured film state. In turn, a photomask for light exposure in a predetermined pattern (optical waveguide pattern) is put on a surface of the uncured core formation layer. Then, the core formation layer is irradiated with light such as ultraviolet radiation via the photomask and, as required, heat-treated. Thereafter, an unexposed portion (uncured portion) of the uncured core formation layer is dissolved away with the use of a developing liquid, whereby a core layer is formed as having the predetermined pattern.

Subsequently, the cladding layer forming material (photosensitive varnish) prepared by dissolving the inventive photosensitive epoxy resin composition in the organic solvent is applied over the core layer. Then, the cladding layer forming material is irradiated with light such as ultraviolet radiation and, as required, heat-treated, whereby an over-cladding layer (upper cladding layer portion) is formed. Thus, the intended optical waveguide is produced through these process steps. Where the optical waveguide is used for an optical/electrical transmission hybrid board (opto-electric hybrid board) or a like product involving the optical path change, the 45-degree mirror forming process is performed on a surface of the cladding layer of the optical waveguide on the board with the use of laser.

Examples of the substrate include a silicon wafer, a metal substrate, a polymer film, and a glass substrate. Examples of the metal substrate include stainless steel plates such as of JIS SUS. Specific examples of the polymer film include a polyethylene terephthalate (PET) film, a polyethylene naphthalate film and a polyimide film. The substrate typically has a thickness of 10 μm to 3 mm.

Specifically, the light irradiation may be irradiation with ultraviolet radiation. Exemplary ultraviolet light sources for the irradiation with the ultraviolet radiation include a low-pressure mercury lamp, a high-pressure mercury lamp and an ultrahigh-pressure mercury lamp. The dose of the ultraviolet radiation is typically about 10 to about 20000 mJ/cm$^2$, preferably about 100 to about 15000 mJ/cm$^2$, more preferably about 500 to about 10000 mJ/cm$^2$.

After the light exposure by the irradiation with the ultraviolet radiation or the like, the heat treatment may be further performed to complete a photoreaction for the curing. The heat treatment is typically performed at 80° C. to 250° C. for 10 seconds to 2 hours, preferably at 100° C. to 150° C. for 5 minutes to 1 hour.

The core layer forming material is, for example, an epoxy resin composition containing any of various liquid epoxy resins such as a bisphenol-A epoxy resin, a bisphenol-F epoxy resin, a hydrogenated bisphenol-A epoxy resin, a fluorinated epoxy resin, and an epoxy-modified silicone resin, any of various solid epoxy resins such as a solid polyfunctional aliphatic epoxy resin, and any of the aforementioned photoacid generators. The formulation of the core layer forming material is designed so that the core layer forming material has a higher refractive index than the cladding layer forming material. For preparation of the core layer forming material to be applied in the form of a varnish, as required, any of conventionally known various organic solvents may be used in a proper amount so as to impart the varnish with a viscosity suitable for the application of the varnish, and various additives (an antioxidant, an adhesiveness imparting agent, a leveling agent, and a UV absorbing agent) may be used in proper amounts as long as the functions of the optical waveguide produced by using the cladding layer forming material are not impaired.

Examples of the organic solvent to be used for the preparation of the varnish include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfurane and dimethoxyethane as in the aforementioned case. These organic solvents may be used alone or in combination in a proper amount so as to impart the varnish with a viscosity suitable for the application of the varnish.

Exemplary methods for the application of the forming materials for the respective layers on the substrate include coating methods employing a spin coater, a coater, a spiral coater, a bar coater or the like, a screen printing method, a capillary injection method in which the material is injected into a gap formed with the use of spacers by the capillary phenomenon, and a continuous R-to-R coating method employing a coating machine such as a multi-coater. The optical waveguide may be provided in the form of a film optical waveguide by removing the substrate.

<<Mirror Forming Process>>

A known method such an a laser processing method, a dicing method or an inprint method may be employed for the mirror forming process. Particularly, the laser processing method is preferably used. A laser light source is properly selected according to the laser oscillation wavelength. Examples of the laser light source include various gas lasers such as excimer laser, $CO_2$ laser, and He—Ne laser. Particularly, ArF excimer laser, KrF excimer laser, $F_2$ excimer laser or the like is preferably used as the laser light source.

The laser irradiation energy is properly set according to the type of the optical waveguide material. For efficient removal of the resin component, the laser irradiation energy is preferably 100 to 1000 mJ/cm$^2$, particularly preferably 200 to 600 mJ/cm$^2$. For improvement of the mirror forming process productivity, the laser irradiation frequency is preferably 10 to 250 Hz, particularly preferably 50 to 200 Hz. The movement speed of the laser processing object is properly set according to the type of the optical waveguide material and the design (e.g., angle) of the mirror surface to be formed. The laser wavelength is properly set according to the type of the optical waveguide material, but may be, for example, about 150 nm to about 300 nm.

The optical waveguide thus produced may be used as an optical waveguide, for example, for a hybrid flexible printed wiring board for optical/electrical transmission.

EXAMPLES

Next, the present disclosure will be described by way of examples thereof. However, it should be understood that the present disclosure be not limited to these examples. In the examples, the term "part(s)" means "part(s) by weight" unless otherwise specified.

Example 1

Prior to production of an optical waveguide according to the example, photosensitive varnishes were prepared as a cladding layer forming material and a core layer forming material.

<Preparation of Cladding Layer Forming Material>

Under shaded conditions, 70 parts of a solid bisphenol-A epoxy resin (JER1001 having a softening point of 64° C. and available from Mitsubishi Chemical Corporation), 20 parts of a solid polyfunctional aliphatic epoxy resin (EHPE3150 having a softening point of 70° C. to 90° C. and available from Daicel Corporation), 10 parts of a long-chain bifunctional semi-aliphatic epoxy resin (EXA-4816 (liquid) available from DIC Corporation), 0.5 parts of a photo-cationic polymerization initiator (photoacid generator) (CPI-101A available from San-Apro, Ltd.), 0.5 parts of a hindered phenol antioxidant (Songnox 1010 available from Kyodo Chemical Co., Ltd.), and 0.5 parts of a phosphate antioxidant (HCA available from Sanko Co., Ltd.) were mixed with and completely dissolved in 50 parts of ethyl lactate at 100° C. with heating and stirring. Thereafter, the resulting solution was cooled to a room temperature (25° C.), and then filtered under higher-temperature and higher-pressure conditions with the use of a membrane filter having a diameter of 1.0 μm. Thus, a photosensitive varnish was prepared as the cladding layer forming material.

<Preparation of Core Layer Forming Material>

Under shaded conditions, 50 parts of a solid polyfunctional aromatic epoxy resin (YDCN-700-3 available from Nippon Steel & Sumikin Chemical Co., Ltd.), 30 parts of a solid bisphenol-A epoxy resin (JER1002 available from Mitsubishi Chemical Corporation), 20 parts of a solid fluorene-containing bifunctional epoxy resin (OGSOL PG-100 available from Osaka Gas Chemicals Co., Ltd.), 0.5 parts of a photoacid generator (CPI-101A available from San-Apro, Ltd.), 0.5 parts of a hindered phenol antioxidant (Songnox 1010 available from Kyodo Chemical Co., Ltd.), and 0.125 parts of a phosphate antioxidant (HCA available from Sanko Co., Ltd.) were mixed with and completely dissolved in 50 parts of ethyl lactate at 105° C. with heating and stirring. Thereafter, the resulting solution was cooled to a room temperature (25° C.), and then filtered under higher-temperature and higher-pressure conditions with the use of a membrane filter having a diameter of 1.0 μm. Thus, a photosensitive varnish was prepared as the core layer forming material.

<<Production of Optical Waveguide>>

<Formation of Under-Cladding Layer>

The photosensitive varnish as the cladding layer forming material was applied onto a back surface of a flexible printed circuit (FPC) board substrate having an overall thickness of 22 μm by means of a spin coater, and then dried on a hot plate (at 130° C. for 10 minutes) for removal of the organic solvent (ethyl lactate). In turn, the resulting layer was exposed via a mask pattern by means of a UV irradiation machine (at 5000 mJ/cm$^2$ with an I-line filter), and further subjected to a post heat treatment (at 130° C. for 10 minutes). Subsequently, the resulting layer was developed in γ-butyrolactone (at a room temperature (25° C.) for 3 minutes) and rinsed with water, and then dried on a hot plate (at 120° C. for 5 minutes) for removal of water. Thus, an under-cladding layer (having a thickness of 15 μm) was formed.

<Formation of Core Layer>

The photosensitive varnish as the core layer forming material was applied onto the thus formed under-cladding layer by means of a spin coater, and then dried on a hot plate (at 130° C. for 5 minutes) for removal of the organic solvent (ethyl lactate). Thus, an uncured layer was formed in an uncured film state. The uncured layer thus formed was subjected to glass mask pattern exposure (pattern width/pattern pitch (L/S)=50 μm/200 μm) at 8000 mJ/cm$^2$ (integrated at a wavelength of 365 nm) by means of a UV irradiation machine (including an ultrahigh-pressure mercury lamp capable of emitting full spectrum light without a band pass filter), and to a post heat treatment (at 140° C. for 10 minutes). Thereafter, the resulting layer was developed in γ-butyrolactone (at a room temperature (25° C.) for 3 minutes), and rinsed with water. Then, the resulting layer was dried on a hot plate (at 120° C. for 5 minutes) for removal of water. Thus, a core layer (having a thickness of 50 μm) was formed in a predetermined pattern.

<Formation of Over-Cladding Layer>

The photosensitive varnish as the cladding layer forming material was applied over the thus formed core layer by means of a spin coater, and then dried on a hot plate (at 130° C. for 10 minutes) for removal of the organic solvent (ethyl lactate). Thereafter, the resulting layer was exposed at 5000 mJ/cm$^2$ (with an I-line filter), and then subjected to a post-exposure heat treatment (PEB process) at 130° C. for 10 minutes. Further, the resulting layer was developed in γ-butyrolactone (at a room temperature (25° C.) for 3 minutes) and rinsed with water, and then dried on a hot plate (at 120° C. for 10 minutes) for removal of water. Thus, an over-cladding layer (having a thickness of 10 μm on the core layer) was formed.

Thus, the optical waveguide (having an overall thickness of 75 μm) was produced, which included the under-cladding layer formed in the predetermined pattern on the back surface of the FPC substrate, the core layer formed in the predetermined pattern on the under-cladding layer, and the over-cladding layer formed over the core layer.

Example 2

A photosensitive varnish an a cladding layer forming material was prepared in substantially the same manner as in Example 1, except that the formulation of the resin component was changed to include 70 parts of a solid bisphenol-A epoxy resin (JER1002 having a softening point of 78° C. and available from Mitsubishi Chemical Corporation), 20 parts of the solid polyfunctional aliphatic epoxy resin (EHPE3150 having a softening point of 70° C. to 90° C. and available from Daicel Corporation), and 10 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Example 3

A photosensitive varnish an a cladding layer forming material was prepared in substantially the same manner as in Example 1, except that the formulation of the resin component was changed to include 65 parts of the solid bisphenol-A epoxy resin (JER1002 having a softening point of 78° C. and available from Mitsubishi Chemical Corporation), 25 parts of the solid polyfunctional aliphatic epoxy resin (EHPE3150 having a softening point of 70° C. to 90° C. and available from Daicel Corporation), and 10 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Example 4

A photosensitive varnish as a cladding layer forming material was prepared in substantially the same manner as in Example 1, except that the formulation of the resin component was changed to include 60 parts of the solid bisphenol-A epoxy resin (JER1002 having a softening point of 78° C. and available from Mitsubishi Chemical Corporation), 30 parts of the solid polyfunctional aliphatic epoxy resin (EHPE3150 having a softening point of 70° C. to 90° C. and available from Daicel Corporation), and 10 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Example 5

A photosensitive varnish as a cladding layer forming material was prepared in substantially the same manner as in Example 1, except that the formulation of the resin component was changed to include 65 parts of the solid bisphenol-A epoxy resin (JER1002 having a softening point of 78° C. and available from Mitsubishi Chemical Corporation), 30 parts of the solid polyfunctional aliphatic epoxy resin (EHPE3150 having a softening point of 70° C. to 90° C. and available from Daicel Corporation), and 5 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Example 6

A photosensitive varnish as a cladding layer forming material was prepared in substantially the same manner as in Example 1, except that the formulation of the resin component was changed to include 60 parts of the solid bisphenol-A epoxy resin (JER1002 having a softening point of 78° C. and available from Mitsubishi Chemical Corporation), 35 parts of the solid polyfunctional aliphatic epoxy resin (EHPE3150 having a softening point of 70° C. to 90° C. and available from Daicel Corporation), and 5 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Example 7

A photosensitive varnish an a cladding layer forming material was prepared in substantially the same manner as in Example 1, except that the formulation of the resin component was changed to include 70 parts of a solid bisphenol-A epoxy resin (JER1003 having a softening point of 89° C. and available from Mitsubishi Chemical Corporation), 20 parts of the solid polyfunctional aliphatic epoxy resin (EHPE3150 having a softening point of 70° C. to 90° C. and available from Daicel Corporation), and 10 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Comparative Example 1

A photosensitive varnish an a cladding layer forming material was prepared in substantially the same manner as in Example 1, except that the formulation of the resin component was changed to include 75 parts of the solid bisphenol-A epoxy resin (JER1001 having a softening point of 64° C. and available from Mitsubishi Chemical Corporation), 20 parts of the solid polyfunctional aliphatic epoxy resin (EHPE3150 having a softening point of 70° C. to 90° C. and available from Daicel Corporation), and 5 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Comparative Example 2

A photosensitive varnish as a cladding layer forming material was prepared in substantially the same manner as in Example 1, except that the formulation of the resin component was changed to include 45 parts of the solid bisphenol-A epoxy resin (JER1001 having a softening point of 64° C. and available from Mitsubishi Chemical Corporation), 45 parts of the solid polyfunctional aliphatic epoxy resin (EHPE3150 having a softening point of 70° C. to 90° C. and available from Daicel Corporation), and 10 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Comparative Example 3

A photosensitive varnish as a cladding layer forming material was prepared in substantially the same manner as in Example 1, except that the formulation of the resin component was changed to include 80 parts of the solid bisphenol-A epoxy resin (JER1002 having a softening point of 78° C. and available from Mitsubishi Chemical Corporation), 10 parts of the solid polyfunctional aliphatic epoxy resin (EHPE3150 having a softening point of 70° C. to 90° C. and available from Daicel Corporation), and 10 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Comparative Example 4

A photosensitive varnish as a cladding layer forming material was prepared in substantially the same manner as in Example 1, except that the formulation of the resin component was changed to include 75 parts of the solid bisphenol-A epoxy resin (JER1002 having a softening point of 78° C. and available from Mitsubishi Chemical Corporation), 15 parts of the solid polyfunctional aliphatic epoxy resin (EHPE3150 having a softening point of 70° C. to 90° C. and available from Daicel Corporation), and 10 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Comparative Example 5

A photosensitive varnish an a cladding layer forming material was prepared in substantially the same manner as in Example 1, except that the formulation of the resin component was changed to include 70 parts of the solid bisphenol-A epoxy resin (JER1002 having a softening point of 78° C. and available from Mitsubishi Chemical Corporation) and 30 parts of the solid polyfunctional aliphatic epoxy resin (EHPE3150 having a softening point of 70° C. to 90° C. and available from Daicel Corporation) without the use of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Comparative Example 6

A photosensitive varnish an a cladding layer forming material was prepared in substantially the same manner as in Example 1, except that the formulation of the resin component was changed to include 65 parts of the solid bisphenol-A epoxy resin (JER1002 having a softening point of 78° C. and available from Mitsubishi Chemical Corporation), 20 parts of the solid polyfunctional aliphatic epoxy resin (EHPE3150 having a softening point of 70° C. to 90° C. and available from Daicel Corporation), and 15 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Comparative Example 7

A photosensitive varnish as a cladding layer forming material was prepared in substantially the same manner as in Example 1, except that the formulation of the resin component was changed to include 50 parts of the solid bisphenol-A epoxy resin (JER1002 having a softening point of 78° C. and available from Mitsubishi Chemical Corporation), 40 parts of the solid polyfunctional aliphatic epoxy resin (EHPE3150 having a softening point of 70° C. to 90° C. and available from Daicel Corporation), and 10 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Comparative Example 8

A photosensitive varnish as a cladding layer forming material was prepared in substantially the same manner as in Example 1, except that the formulation of the resin component was changed to include 75 parts of the solid bisphenol-A epoxy resin (JER1003 having a softening point of 89° C. and available from Mitsubishi Chemical Corporation), 20 parts of the solid polyfunctional aliphatic epoxy resin (EHPE3150 having a softening point of 70° C. to 90° C. and available from Daicel Corporation), and 5 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Comparative Example 9

A photosensitive varnish as a cladding layer forming material was prepared in substantially the same manner as in Example 1, except that the formulation of the resin component was changed to include 50 parts of the solid bisphenol-A epoxy resin (JER1002 having a softening point of 78° C. and available from Mitsubishi Chemical Corporation), 40 parts of the solid polyfunctional aliphatic epoxy resin (EHPE3150 having a softening point of 70° C. to 90° C. and available from Daicel Corporation), and 10 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

Comparative Example 10

A photosensitive varnish an a cladding layer forming material was prepared in substantially the same manner as in Example 1, except that the formulation of the resin component was changed to include 70 parts of a solid bisphenol-A epoxy resin (JER1007 having a softening point of 128° C. and available from Mitsubishi Chemical Corporation), 20 parts of the solid polyfunctional aliphatic epoxy resin (EHPE3150 having a softening point of 70° C. to 90° C. and available from Daicel Corporation), and 10 parts of the long-chain bifunctional semi-aliphatic epoxy resin (EXA-4816 (liquid) available from DIC Corporation). Then, an optical waveguide was produced in substantially the same manner as in Example 1 by using the photosensitive varnish thus prepared as the cladding layer forming material.

The photosensitive varnishes thus prepared as the cladding layer forming materials and the optical waveguides thus produced were evaluated for the R-to-R adaptability, the cladding layer refractive index, the cladding layer patternability, the laser processability, and comprehensive evaluation by performing measurement in the following manner. The results are shown below together with the formulations of the respective cladding layer forming materials in Tables 1 and 2.

[R-to-R Adaptability]

The photosensitive varnishes prepared as the cladding layer forming materials in Examples and Comparative Examples were evaluated through the following measurement.

(1) Tackiness

The cladding layer forming materials (photosensitive varnishes) were each applied onto a silicon wafer, and then the resulting silicon wafer was prebaked (heat-dried) on a hot plate at 130° C. for 5 minutes. Thus, a coating film having a thickness of about 50 μm was formed. A surface of the coating film was touched with a finger for 10 seconds and, when the finger was released from the coating film, the state of the surface was checked for tackiness.

(2) Flexibility of Uncured Product (Uncured Film)

The cladding layer forming materials (photosensitive varnishes) were each applied onto a polyethylene terephthalate (PET) substrate, and then heat-dried (at 130° C. for 5 minutes). Thus, an uncured film (amorphous film) having a thickness of about 50 μm was formed. Then, the amorphous film on the PET substrate was rolled around an 8-cm diameter roll core and a 4-cm diameter roll core, and checked for cracking after being rolled.

(3) Flexibility of Cured Product (Cured Film)

The cladding layer forming materials (photosensitive varnishes) were each applied onto a PET substrate, and then heat-dried (at 130° C. for 5 minutes). Thus, an uncured film (amorphous film) having a thickness of about 50 μm was formed. Subsequently, the amorphous film on the PET substrate was exposed to mixed radiation at 8000 mJ/cm$^2$ based on illuminance at a wavelength of 365 nm (by means of an ultrahigh-pressure mercury lamp without a band pass filter) through a 5-mm thick glass mask (having no pattern), and then subjected to a post heat treatment at 140° C. for 10 minutes. Thus, a cured film was formed. The cured film thus formed on the PET substrate was rolled around an 8-cm diameter roll core and a 4-cm diameter roll core with the cured film outside. At this time, the cured film was visually checked for cracking.

Based on the results of the checking of the respective measurement items, the cladding layer forming materials were each evaluated for the R-to-R adaptability according to the following criteria:

Excellent (○): The coating film was free from tackiness, and the uncured film and the cured film were free from cracking when being rolled around the 4-cm diameter roll core.

Acceptable (Δ): The coating film was free from tackiness. The uncured film and the cured film were free from cracking when being rolled around the 8-cm diameter roll core, but the cured film suffered from cracking when being rolled around the 4-cm diameter roll core.

Unacceptable (x): The uncured film and the cured film suffered from cracking when being rolled around the 8-cm diameter roll core, and/or the coating film suffered from tackiness.

[Refractive Index]

The cladding layer forming materials (photosensitive varnishes) were each applied onto a 0.8-mm thick silicon wafer by means of a spin coater, and then heat-dried at 130° C. for 10 minutes. Subsequently, the resulting film was exposed to mixed radiation at 8000 mJ/cm$^2$ based on illuminance at 365 nm (by means of an ultrahigh-pressure mercury lamp without a band pass filter) through a 5-mm thick glass mask (having no pattern), and then subjected to a post heat treatment at 140° C. for 10 minutes. Thus, a sample (having a thickness of 10 μm) for refractive index evaluation was prepared. The refractive index of the sample thus prepared was measured at a wavelength of 850 nm by means of a prism coupler (SPA-4000) available from SAIRON TECHNOLOGY, Inc. Based on the results, the sample was evaluated according to the following criteria:

Excellent (○): The refractive index was not higher than 1.560 at a wavelength of 850 nm.

Acceptable (Δ): The refractive index was higher than 1.560 and not higher than 1.565 at a wavelength of 850 nm.

Unacceptable (x): The refractive index was higher than 1.565 at a wavelength of 850 nm.

[Patternability]

The patterns of the cladding layers formed under the aforementioned conditions were each observed by means of a microscope for checking the appearance thereof. Based on the results, the pattern was evaluated according to the following criteria:

Excellent (○): The pattern had a rectangular shape.

Acceptable (Δ): The pattern had a rounded portion at its upper portion, but was not functionally problematic.

Unacceptable (x): The pattern had an abnormal shape, and was functionally problematic.

[Laser Processability]

Cladding layer surfaces of the produced optical waveguides were each processed under predetermined processing conditions (at an energy density of 300 mJ/cm$^2$ at a frequency of 50 Hz) by means of excimer laser, whereby the optical waveguides were each formed with a 45-degree mirror surface. Then, the optical waveguides each formed with the 45-degree mirror surface by the laser processing were each used as a sample, and evaluated in the following manner. Light emitted from an 850-nm VCSEL light source OP250 (available from Miki Inc.) was collected and inputted into the sample optical waveguide through a multi-mode fiber (FFP-G120-0500 available from Miki Inc., and having an MMF diameter of 50 μm and an NA of 0.2). Then, light outputted from the sample optical waveguide was collected by a lens (FH14-11 available from Seiwa Optical Co., Ltd., and having a magnification of 20 and an NA of 0.4), and detected at 6 channels by a light measurement system (optical multi-power meter Q8221 available from Advantest Corporation) for evaluation. Based on the results, the sample optical waveguide was evaluated according to the following criteria:

Excellent (○): The formed 45-degree mirror had a light loss of not greater than 1.0 dB.

Acceptable (Δ): The formed 45-degree mirror had a light loss of greater than 1.0 dB and not greater than 1.5 dB.

Unacceptable (x): The formed 45-degree mirror had a light loss of greater than 1.5 dB.

[Comprehensive Evaluation]

Based on the above evaluation results, comprehensive evaluation was performed according to the following criteria:

Excellent (○): All the ratings of the evaluation items were excellent (○).

Acceptable (Δ): one of the ratings of the evaluation items was acceptable (Δ).

Unacceptable (x): At least one of the ratings of the evaluation items was unacceptable (x), or two or more of the ratings of the evaluation items were acceptable (Δ).

TABLE 1

| Category | Product name | State | Softening point | Example 1 | 2 | 3 | 4 | 5 | 6 | 7 |
|---|---|---|---|---|---|---|---|---|---|---|
| Bisphenol-A epoxy resin (a) | JER1001 | Solid | 64° C. | 70 | — | — | — | — | — | — |
| | JER1002 | | 78° C. | — | 70 | 65 | 60 | 65 | 60 | — |
| | JER1003 | | 89° C. | — | — | — | — | — | — | 70 |
| | JER1007 | | 128° C. | — | — | — | — | — | — | — |
| Polyfunctional aliphatic epoxy resin (b) | EHPE3150 | Solid | 70° C.-90° C. | 20 | 20 | 25 | 30 | 30 | 35 | 20 |
| Long-chain bifunctional semi-aliphatic epoxy resin (c) | EXA-4816 | Liquid at ordinary temperature | | 10 | 10 | 1.0 | 10 | 5 | 5 | 10 |
| Photoacid generator | CPI-101A | — | — | 0.5 | 0.5 | 0.5 | 0.5 | 0.5 | 0.5 | 0.5 |
| Antioxidant | Songnox 1010 | — | — | 0.5 | 0.5 | 0.5 | 0.5 | 0.5 | 0.5 | 0.5 |
| | HCA | — | — | 0.5 | 0.5 | 0.5 | 0.5 | 0.5 | 0.5 | 0.5 |
| Organic solvent (ethyl lactate) | | — | — | 50 | 50 | 50 | 50 | 50 | 50 | 50 |
| R-to-R adaptability | | | | ○ | ○ | ○ | ○ | ○ | ○ | ○ |
| Refractive index | | | | Δ 1.564 | Δ 1.564 | Δ 1.561 | ○ 1.557 | ○ 1.558 | ○ 1.554 | Δ 1.564 |
| Patternability | | | | ○ | ○ | ○ | ○ | ○ | ○ | ○ |
| Laser processability | | | | ○ | ○ | ○ | ○ | ○ | ○ | ○ |
| Comprehensive evaluation | | | | Δ | Δ | Δ | ○ | ○ | ○ | Δ |

TABLE 2

| Category | Product name | State | Softening point | Comparative Example 1 | 2 | 3 | 4 | 5 | 6 | 7 | 8 | 9 | 10 |
|---|---|---|---|---|---|---|---|---|---|---|---|---|---|
| Bisphenol-A epoxy resin (a) | JER1001 | Solid | 64° C. | 75 | 45 | — | — | — | — | — | — | — | — |
| | JER1002 | | 78° C. | — | — | 80 | 75 | 70 | 65 | 50 | — | 50 | — |
| | JER1003 | | 89° C. | — | — | — | — | — | — | — | 75 | — | — |
| | JER1007 | | 128° C. | — | — | — | — | — | — | — | — | — | 70 |
| Polofunctional aliphatic expoxy resin (b) | KHPE3150 | Solid | 70° C.-90° C. | 20 | 45 | 10 | 15 | 30 | 20 | 40 | 20 | 40 | 20 |
| Long-chain bifunctional semi-aliphatic epoxy resin (c) | EXA-4816 | Liquid at ordinary temperature | | 5 | 10 | 10 | 10 | — | 15 | 10 | 5 | 10 | 10 |
| Photoacid generator | CPI-101A | — | — | 0.5 | 0.5 | 0.5 | 0.5 | 0.5 | 0.5 | 0.5 | 0.5 | 0.5 | 0.5 |
| Antioxidant | Songnox 1010 | — | — | 0.5 | 0.5 | 0.5 | 0.5 | 0.5 | 0.5 | 0.5 | 0.5 | 0.5 | 0.5 |
| | HCA | — | — | 0.5 | 0.5 | 0.5 | 0.5 | 0.5 | 0.5 | 0.5 | 0.5 | 0.5 | 0.5 |
| Organic solvent (ethyl lactate) | | — | — | 50 | 50 | 50 | 50 | 50 | 50 | 50 | 50 | 50 | 50 |
| R-to-R adaptability | | | | ○ | Δ | ○ | ○ | X | X | Δ | X | Δ | X |
| Refractive index | | | | X 1.566 | ○ 1.545 | X 1.572 | X 1.572 | ○ 1.559 | Δ 1.563 | ○ 1.545 | Δ 1.564 | ○ 1.545 | Δ 1.564 |
| Patternability | | | | ○ | ○ | X | Δ | ○ | ○ | ○ | ○ | ○ | ○ |
| Laser processability | | | | ○ | X | ○ | ○ | ○ | ○ | X | ○ | X | ○ |
| Comprehensive evaluation | | | | X | X | X | X | X | X | X | X | X | X |

The above results indicate that the photosensitive epoxy resin compositions (Examples) each prepared by using the resin component containing the solid bisphenol-A epoxy resin (a) having the specific softening point, the solid polyfunctional aliphatic epoxy resin (b) having the specific softening point, and the liquid long-chain bifunctional semi-aliphatic epoxy resin (c) in the specific proportions were rated as excellent or acceptable in R-to-R adaptability, refractive index, patternability, and laser processability. Particularly, the photosensitive epoxy resin compositions (Examples 4, 5, and 6) each containing the solid bisphenol-A epoxy resin (JER1002 having a softening point of 78° C. and available from Mitsubishi Chemical Corporation), the solid polyfunctional aliphatic epoxy resin (EHPE3150 having a softening point of 70° C. to 90° C. and available from Daicel Corporation), and the long-chain bifunctional semi-aliphatic epoxy resin (EXA-4816 (liquid) available from DIC Corporation) in the specific proportions were excellent in all the evaluation items, and rated as particularly excellent.

In contrast, the photosensitive epoxy resin compositions (Comparative Examples 1 to 9) each prepared by using the resin component containing the solid bisphenol-A epoxy resin (a) having the specific softening point, the solid polyfunctional aliphatic epoxy resin (b) having the specific softening point, and the liquid long-chain bifunctional semi-aliphatic epoxy resin (c) in proportions falling outside the specific ranges, and the photosensitive epoxy resin composition (Comparative Example 10) containing the solid bisphenol-A epoxy resin having a softening point of 128° C.

were rated as unacceptable (x) in at least one of the evaluation items and, therefore, had inferior property evaluation results.

While specific forms of the embodiments of the present disclosure have been shown in the aforementioned inventive examples, the inventive examples are merely illustrative of the disclosure but not limitative of the disclosure. It is contemplated that various modifications apparent to those skilled in the art could be made within the scope of the disclosure.

The inventive optical waveguide formation photosensitive epoxy resin composition is useful as a material for formation of a cladding layer of an optical waveguide. The optical waveguide produced by employing the optical waveguide formation photosensitive epoxy resin composition as a cladding layer forming material is used, for example, for a hybrid flexible printed wiring board for optical/electrical transmission, or the like.

The invention claimed is:

1. A photosensitive epoxy resin composition for formation of an optical waveguide, the photosensitive epoxy resin composition comprising:
   an epoxy resin component; and
   a photo-cationic polymerization initiator,
   wherein a resin component of the epoxy resin composition consists of:
   (a) a solid bisphenol-A epoxy resin having a softening point of not higher than 105° C.;
   (b) a solid polyfunctional aliphatic epoxy resin having a softening point of not higher than 105° C.; and
   (c) a liquid long-chain bifunctional semi-aliphatic epoxy resin,
      wherein the epoxy resin (a) is present in a proportion of 60 to 70 wt. % based on a weight of the epoxy resin component,
      wherein the epoxy resin (b) is present in a proportion of 20 to 35 wt. % based on the weight of the epoxy resin component, and
      wherein the epoxy resin (c) is present in a proportion of 5 to 10 wt. % based on the weight of the epoxy resin component.

2. The photosensitive epoxy resin composition according to claim 1, wherein the epoxy resin component consists of the solid bisphenol-A epoxy resin (a), the solid polyfunctional aliphatic epoxy resin (b), and the liquid long-chain bifunctional semi-aliphatic epoxy resin (c).

3. The photosensitive epoxy resin composition according to claim 1,
   wherein the solid bisphenol-A epoxy resin (a) has a softening point of 60° C. to 95° C., and
   wherein the solid polyfunctional aliphatic epoxy resin (b) has a softening point of 60° C. to 95° C.

4. The photosensitive epoxy resin composition according to claim 1, wherein the liquid long-chain bifunctional semi-aliphatic epoxy resin (c) is an epoxy resin represented by the following general formula (1):

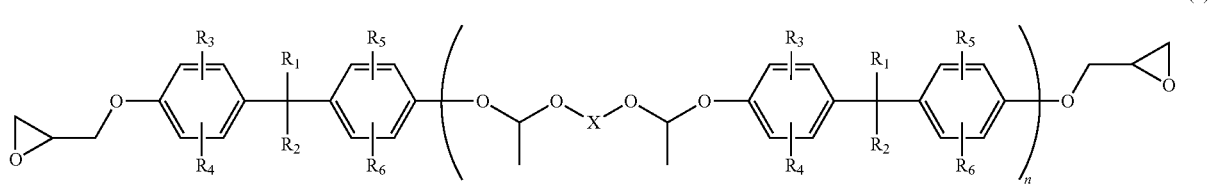

wherein $R_1$ and $R_2$ are each a hydrogen atom or a methyl group; $R_3$ to $R_6$ are each a hydrogen atom, a methyl group, a chlorine atom, or a bromine atom; X is a C2 to C15 alkylene group, an ethyleneoxy group, a diethyleneoxy group, a triethyleneoxy group, a propyleneoxy group, a propyleneoxypropyl group, a di(propyleneoxy)propyl group, or a tri(propyleneoxy)propyl group; and n is a natural number, and has an average value of 1.2 to 5.

5. The photosensitive epoxy resin composition according to claim 1, wherein the photosensitive epoxy resin composition is configured to be a cladding layer forming material for formation of an optical waveguide including a substrate, a cladding layer provided on the substrate, and a core layer provided in a predetermined pattern in the cladding layer for transmission of an optical signal.

6. A photosensitive film for formation of an optical waveguide, which comprises the photosensitive epoxy resin composition according to claim 1.

7. An optical waveguide comprising:
   a substrate;
   a cladding layer provided on the substrate; and
   a core layer provided in a predetermined pattern in the cladding layer for transmission of an optical signal;
   wherein the cladding layer is a cladding layer formed by curing the photosensitive epoxy resin composition according to claim 1.

8. A hybrid flexible printed wiring board for optical/electrical transmission, comprising the optical waveguide according to claim 7.

9. An optical waveguide comprising:
   a substrate;
   a cladding layer provided on the substrate; and
   a core layer provided in a predetermined pattern in the cladding layer for transmission of an optical signal;
   wherein the cladding layer is a cladding layer formed by curing the photosensitive film according to claim 6.

10. A hybrid flexible printed wiring board for optical/electrical transmission, comprising the optical waveguide according to claim 9.

* * * * *